United States Patent
Chen et al.

(10) Patent No.: US 8,987,787 B2
(45) Date of Patent: Mar. 24, 2015

(54) SEMICONDUCTOR STRUCTURE AND METHOD FOR MANUFACTURING THE SAME

(75) Inventors: Shih-Hung Chen, Jhudong Township, Hsinchu County (TW); Kuang-Yeu Hsieh, Hsinchu (TW); Cheng-Yuan Wang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/443,496

(22) Filed: Apr. 10, 2012

(65) Prior Publication Data

US 2013/0264719 A1    Oct. 10, 2013

(51) Int. Cl.
*H01L 27/118* (2006.01)
*H01L 23/52* (2006.01)
*H01L 23/34* (2006.01)
(Continued)

(52) U.S. Cl.
CPC .............. *H01L 23/522* (2013.01); *H01L 24/06* (2013.01); *H01L 25/0652* (2013.01); *H01L 25/0657* (2013.01); *H01L 25/18* (2013.01); *H01L 27/1052* (2013.01); H01L 2224/06177 (2013.01); H01L 24/13 (2013.01); H01L 24/16 (2013.01); H01L 24/73 (2013.01); H01L 2224/0401 (2013.01); H01L 2224/04042 (2013.01); H01L 2224/13111 (2013.01); H01L 2224/13116 (2013.01); H01L 2224/13139 (2013.01); H01L 2224/13144 (2013.01); H01L 2224/13147 (2013.01); H01L 2224/13155 (2013.01); H01L 2224/16145 (2013.01); H01L 2224/73207 (2013.01); H01L 2924/1431 (2013.01); H01L 2924/1435 (2013.01); H01L 2924/1443 (2013.01); H01L 2225/06513 (2013.01); H01L 2225/06541 (2013.01); H01L 2225/06568 (2013.01); H01L 27/0203 (2013.01)
USPC ........... 257/208; 257/202; 257/210; 257/723; 257/774; 257/777; 438/107; 438/266; 438/283; 438/587; 438/599

(58) Field of Classification Search
CPC .................... H01L 27/1052; H01L 27/10897; H01L 27/1116; H01L 27/10894; H01L 27/11531; H01L 25/065; H01L 25/0655; H01L 25/0657; H01L 2225/06555
USPC .................. 257/723, 777, 774, 202, 208, 210
See application file for complete search history.

(56) References Cited

U.S. PATENT DOCUMENTS 5,087,791 A * 2/1992 Magistro ........................ 585/657
6,150,724 A * 11/2000 Wenzel et al. ................. 257/777
(Continued)

*Primary Examiner* — David Zarneke
(74) *Attorney, Agent, or Firm* — McClure, Qualey & Rodack, LLP

(57) ABSTRACT

A semiconductor structure includes first and second chips assembled to each other. The first chip includes N of first conductive lines, M of second conductive lines disposed on the first conductive lines, N of third conductive lines perpendicularly on the second conductive lines and parallel to the first conductive lines, N of first vias connected to the first conductive lines, M sets of second vias connected to the second conductive lines, and N sets of third vias connected to the third conductive lines. The second and first conductive lines form an overlapping area. The third conductive lines and N sets of the third vias include at least two groups respectively disposed in a first and a third regions of the overlapping area. M sets of second vias include at least two groups respectively disposed in a second region and a fourth region of the overlapping area.

20 Claims, 13 Drawing Sheets

(51) Int. Cl.
*H01L 23/48* (2006.01)
*H01L 29/40* (2006.01)
*H01L 21/00* (2006.01)
*H01L 21/336* (2006.01)
*H01L 21/3205* (2006.01)
*H01L 23/522* (2006.01)
*H01L 23/00* (2006.01)
*H01L 25/065* (2006.01)
*H01L 25/18* (2006.01)
*H01L 27/105* (2006.01)
*H01L 27/02* (2006.01)

(56) References Cited

U.S. PATENT DOCUMENTS

| | | | |
|---|---|---|---|
| 6,438,014 B2 * | 8/2002 | Funaba et al. | 365/63 |
| 6,586,266 B1 * | 7/2003 | Lin | 438/15 |
| 6,717,837 B2 * | 4/2004 | Hasegawa et al. | 365/145 |
| 6,917,063 B2 * | 7/2005 | Natori et al. | 257/295 |
| 6,928,512 B2 * | 8/2005 | Ayukawa et al. | 711/105 |
| 7,330,369 B2 * | 2/2008 | Tran | 365/151 |
| 7,873,122 B2 * | 1/2011 | Chung | 375/316 |
| 7,915,647 B2 * | 3/2011 | Kato et al. | 257/210 |
| 7,999,381 B2 * | 8/2011 | Lin | 257/738 |
| 8,072,005 B2 * | 12/2011 | Dehon et al. | 257/208 |
| 8,154,053 B2 * | 4/2012 | Lopes et al. | 257/203 |
| 8,203,211 B2 * | 6/2012 | Jeong et al. | 257/773 |
| 8,395,190 B2 * | 3/2013 | Shim et al. | 257/208 |
| 8,760,927 B2 * | 6/2014 | Deng | 365/185.18 |
| 8,872,183 B2 * | 10/2014 | Chang et al. | 257/67 |
| 8,883,568 B2 * | 11/2014 | Dehon et al. | 438/128 |
| 2003/0200521 A1 * | 10/2003 | DeHon et al. | 716/16 |
| 2009/0242968 A1 * | 10/2009 | Maeda et al. | 257/324 |
| 2011/0065270 A1 * | 3/2011 | Shim et al. | 438/589 |
| 2011/0193086 A1 * | 8/2011 | Lee et al. | 257/48 |
| 2012/0267681 A1 * | 10/2012 | Nemoto et al. | 257/139 |
| 2012/0267689 A1 * | 10/2012 | Chen et al. | 257/203 |

* cited by examiner

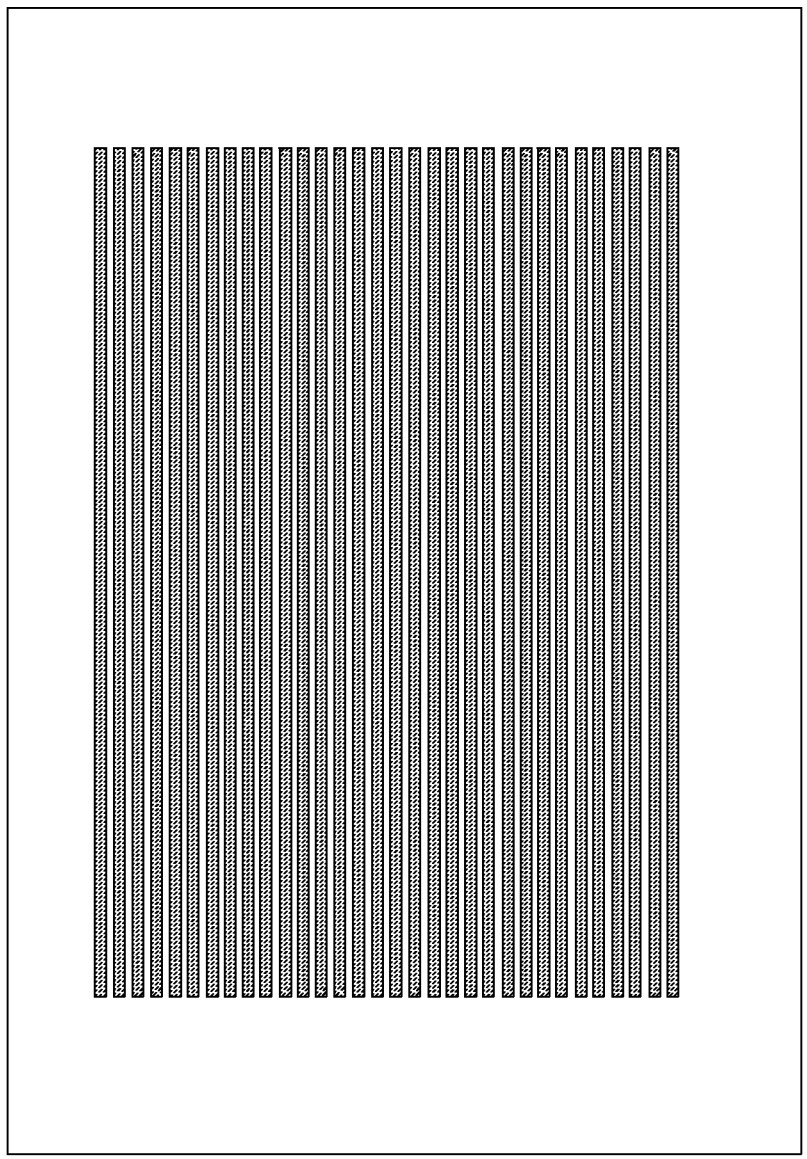

SEMICONDUCTOR STRUCTURE AND METHOD FOR MANUFACTURING THE SAME

BACKGROUND

1. Technical Field

The disclosure relates in general to a semiconductor structure and a method for manufacturing the same, and more particularly to the semiconductor structure and method for separately manufacturing an array region and a periphery region on different chips.

2. Description of the Related Art

FIG. 1 illustrates a conventional chip. The conventional chip includes an array region 10 and a periphery region 20. The array region 10 includes plural parallel bit lines 103 and plural parallel word lines 101 intersected to each other, to form a memory array. The word lines 101 and the bit lines 103 are electrical connected to the periphery region 20 by the contacts 101c, 103c. The periphery region 20 could include different circuit types, such as WL decoder 201 and the BL page buffer 203.

If Cp represents process cost per area of chip, Cp=Cpa+Cpp, Cpa represents process cost per area of array region, Cpp represents process cost per area of periphery region. A is total area of chip. A=Aa+Ap, Aa is area of the array region, and Ap is area of the periphery region. Thus the total cost C =Cp×A= (Cpa+Cpp)×(Aa+Ap)=Cpa×Aa+Cpa×Ap+Cpp×Aa+Cpp× Ap. If the periphery region could be fabricated separately on another chip, the items Cpa×Ap and Cpp×Aa can be removed, and the total cost C could be decreased.

Moreover, the chip size has been reduced, and the feature size of components in the chip, and the areas of the array region and the periphery region have been shrunk, and also the density of word lines 101 and bit lines 103 has been increased. The distances between the contacts 101c and 103c at the ends of the word lines 101 and bit lines 103 become very small. It would be very difficult to connect those contacts 101c and 103c to other chips. Although the adjacent contacts 101c/103c may space apart along the x/y direction to decrease the possibility of short circuit, a certain area is still required for setting those contacts 101c and 103c, thereby limiting the extent of the chip size reduction.

SUMMARY

The disclosure is directed to a semiconductor structure and a method of manufacturing the same. An array chip comprising plural vias is independently fabricated, and is then assembled to a periphery chip. The array chip is electrical connected to the periphery chip by the vias.

According to an aspect of the disclosure, a semiconductor structure includes a first chip and a second chip assembled to each other. The first chip includes parallel N of first conductive lines, parallel M of second conductive lines disposed on the first conductive lines, parallel N of third conductive lines perpendicularly disposed on the second conductive lines and parallel to the first conductive lines, N of first vias respectively connected to the first conductive lines, M sets of second vias respectively connected to the second conductive lines, and N sets of third vias respectively connected to the third conductive lines. Also, the second and first conductive lines form an overlapping area. The overlapping area includes a first region and a third region at a diagonal direction, and a second region and a fourth region at the other diagonal direction. The third conductive lines and N sets of the third vias are divided into at least two parts, which are disposed in the first region and the third region, respectively. M sets of second vias are divided into at least two parts, which are disposed in the second region and the fourth region, respectively.

According to another aspect of the disclosure, a method of manufacturing semiconductor structure is provided. First, a first chip having structure as mentioned above is provided. A second chip is provided. The first chip is then assembled to the second chip.

BRIEF DESCRIPTION OF THE DRAWINGS

FIG. 3A is a mask pattern of N of first conductive lines.

DETAILED DESCRIPTION

The embodiment of the present disclosure provides a semiconductor structure and a method of manufacturing the same. In the disclosure, an array chip is independently fabricated, and plural vias are formed in the array region. The array chip is then assembled to a periphery chip with periphery circuit, wherein the array chip is electrical connected to the periphery chip by the vias. In an embodiment, the array chip further includes plural conductive pads electrical connected to the vias, and the periphery chip includes plural bonding pads correspondingly. After assembly of the array chip and the periphery chip, the contact between the conductive pads and the bonding pads with larger contact area has improved the reliability of electrical connection between the array chip and the periphery chip.

Figure 1:
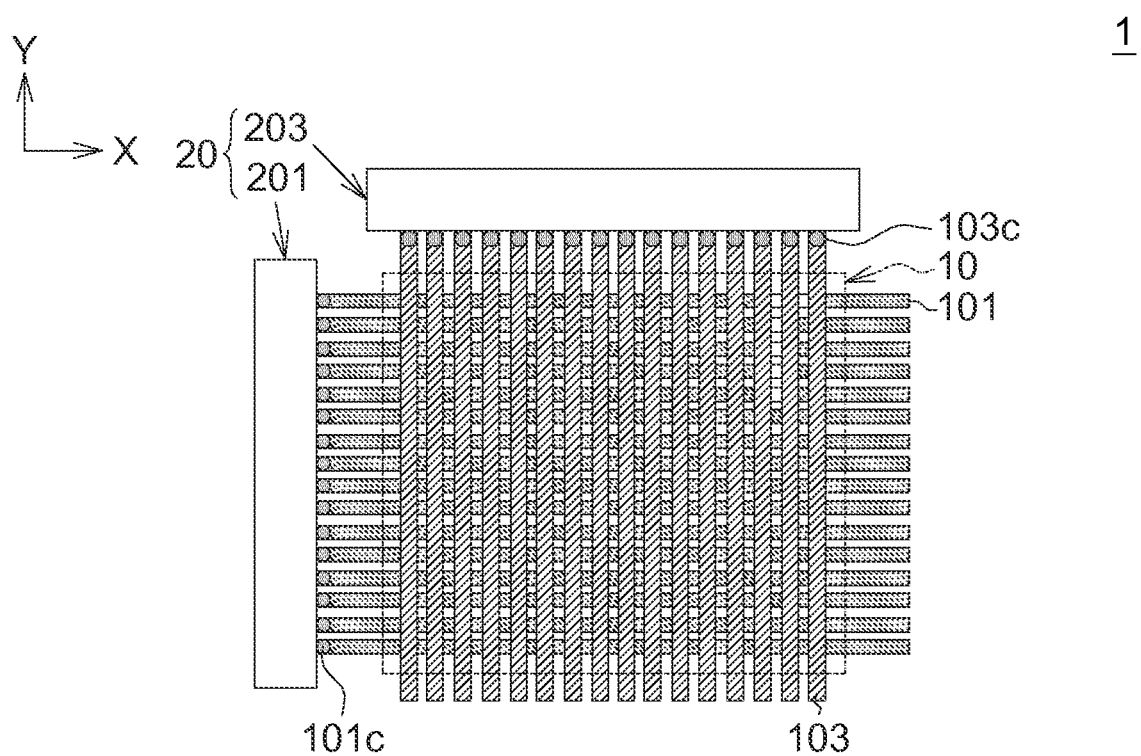
FIG. 1 illustrates a conventional chip.
Figure 2:
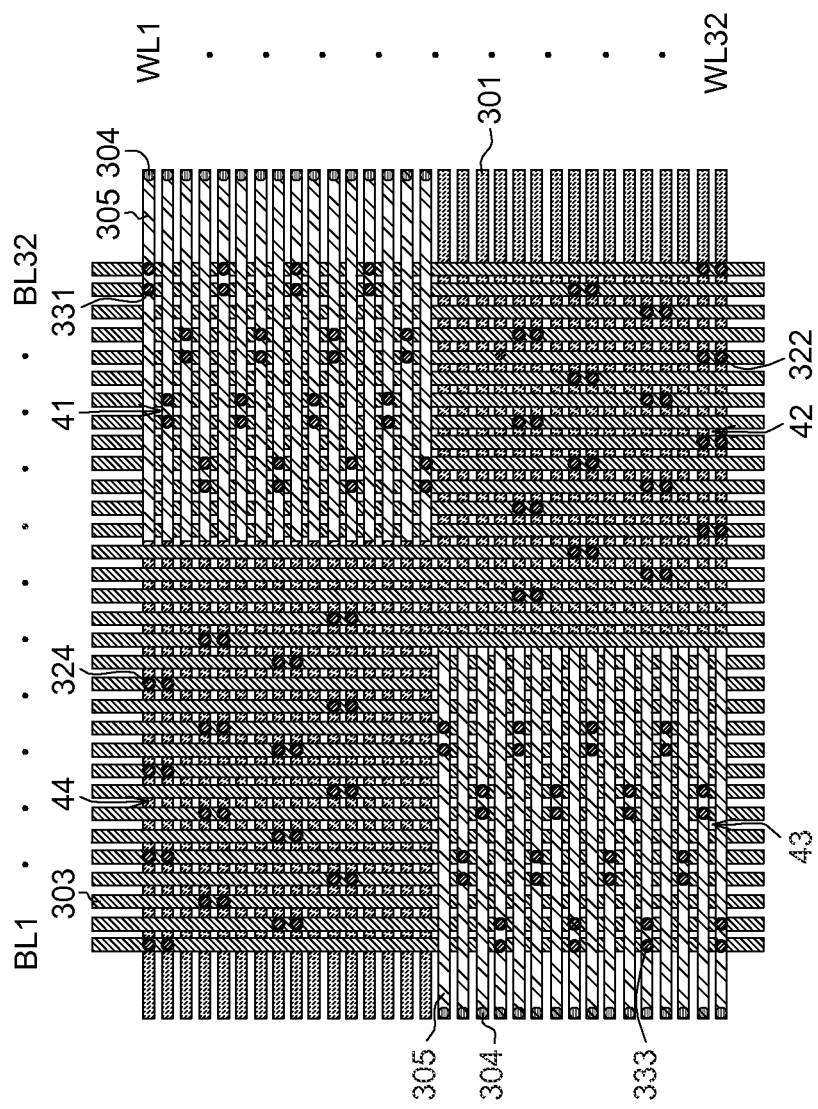
FIG. 2 is a top view of an array chip according to one embodiment of the disclosure.
Figure 3B:
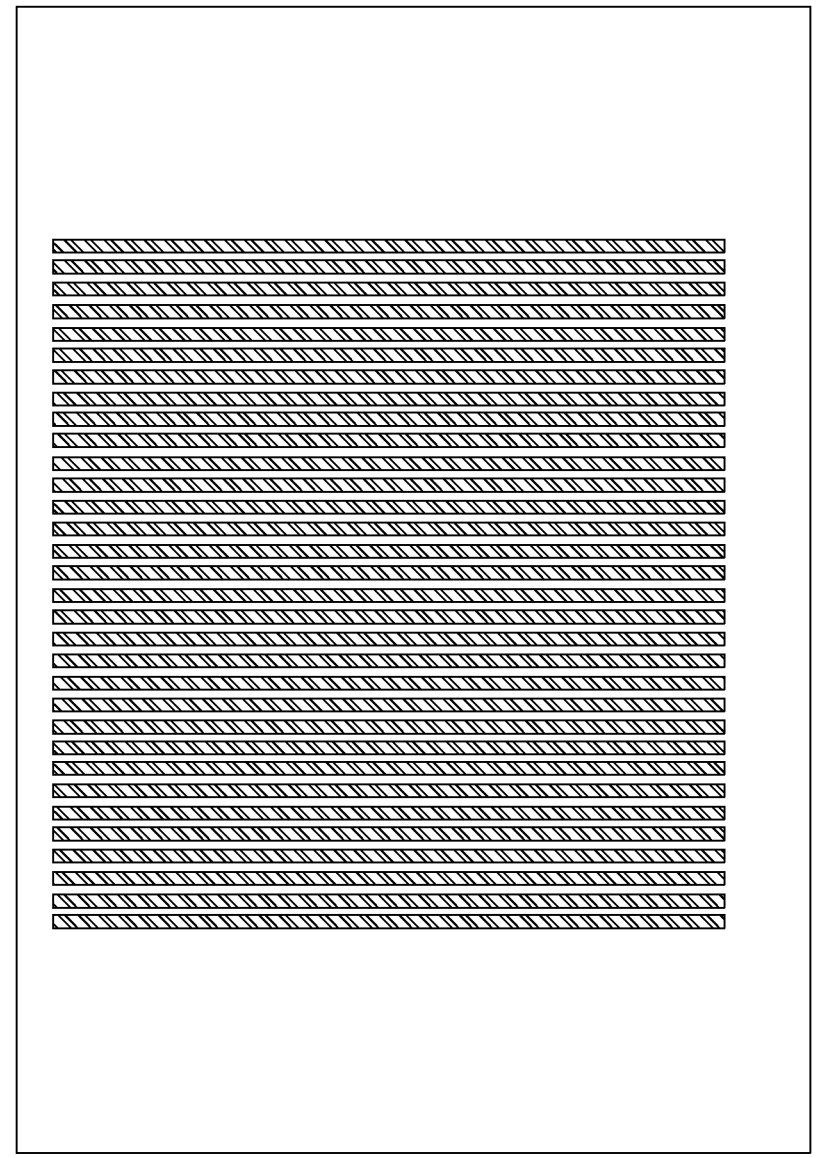
FIG. 3B is a mask pattern of M of second conductive lines.
Figure 3C:
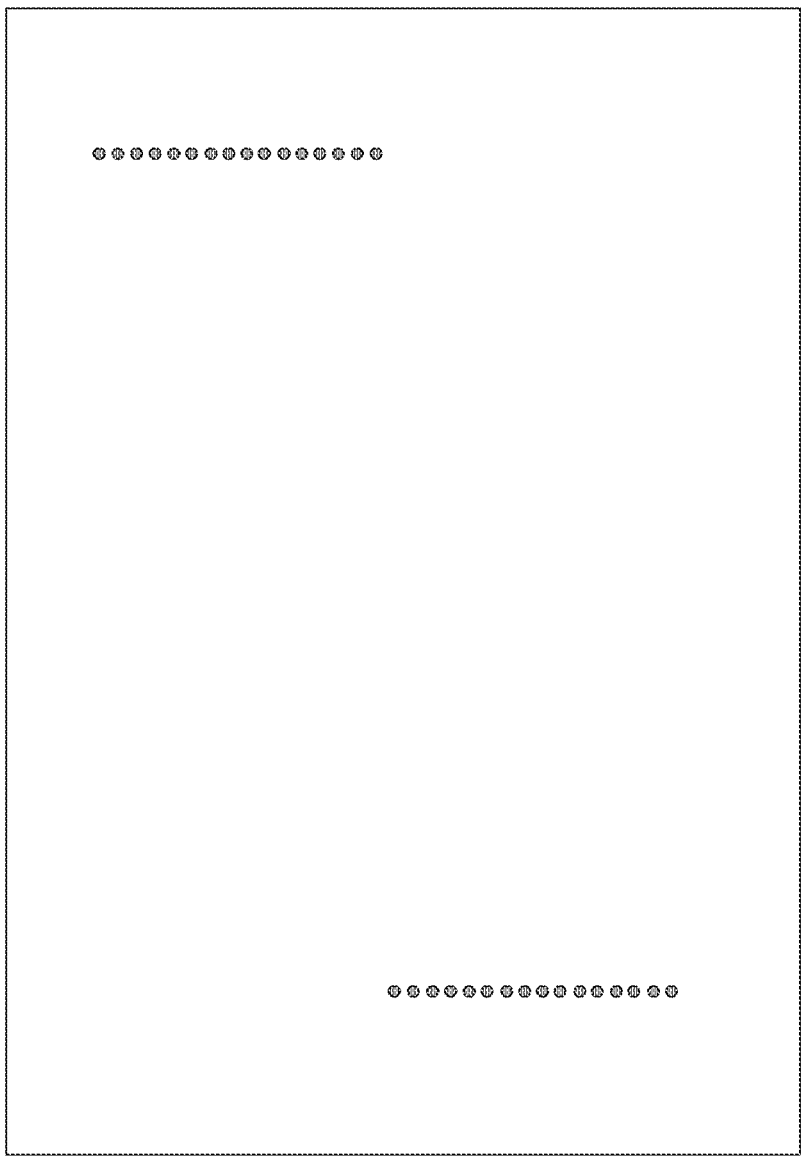
FIG. 3C is a mask pattern of N of first vias.
Figure 3D:
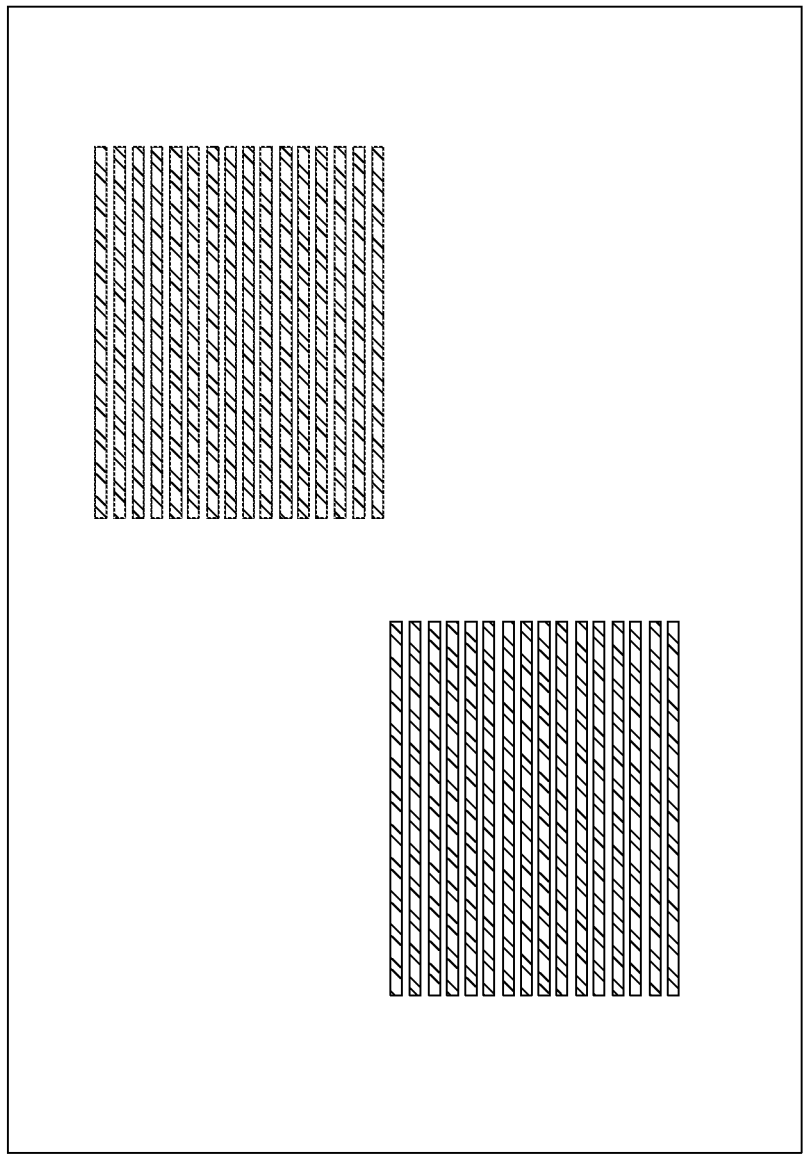
FIG. 3D is a mask pattern of N of third conductive lines.
Figure 3E:
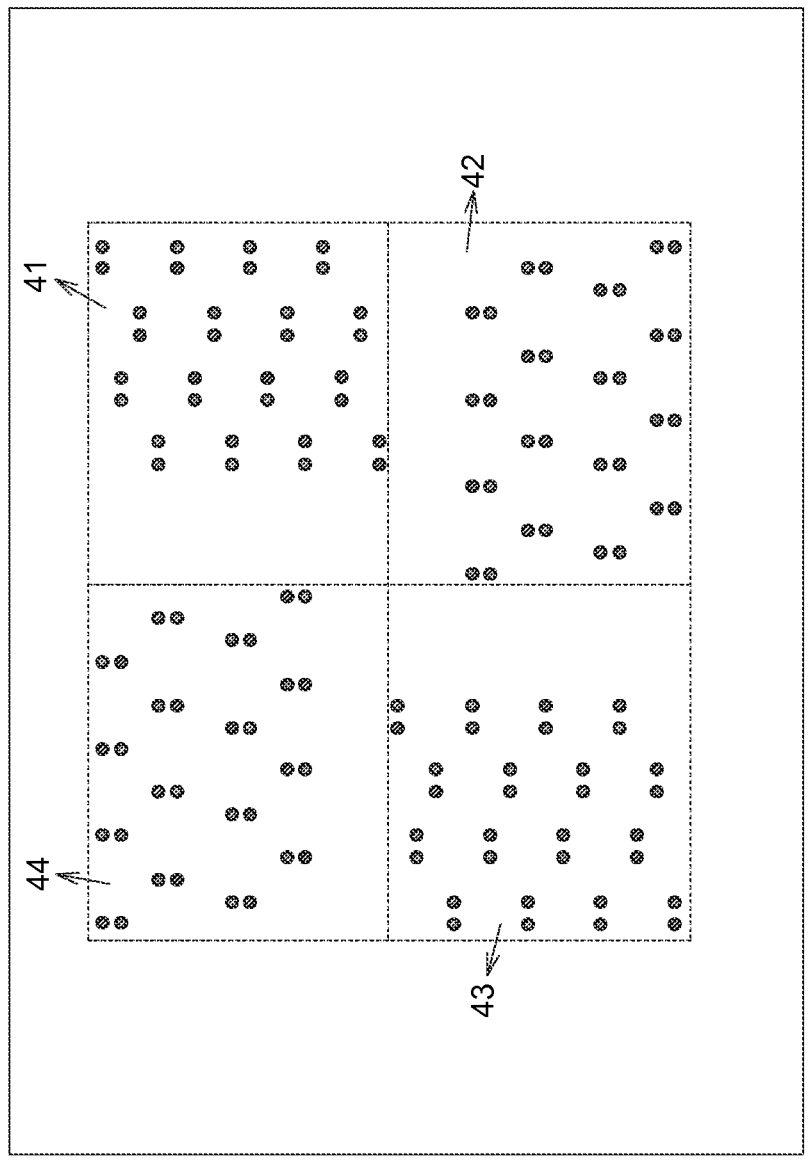
FIG. 3E is a mask pattern of M sets of second vias and N sets of third vias.
Figure 3F:
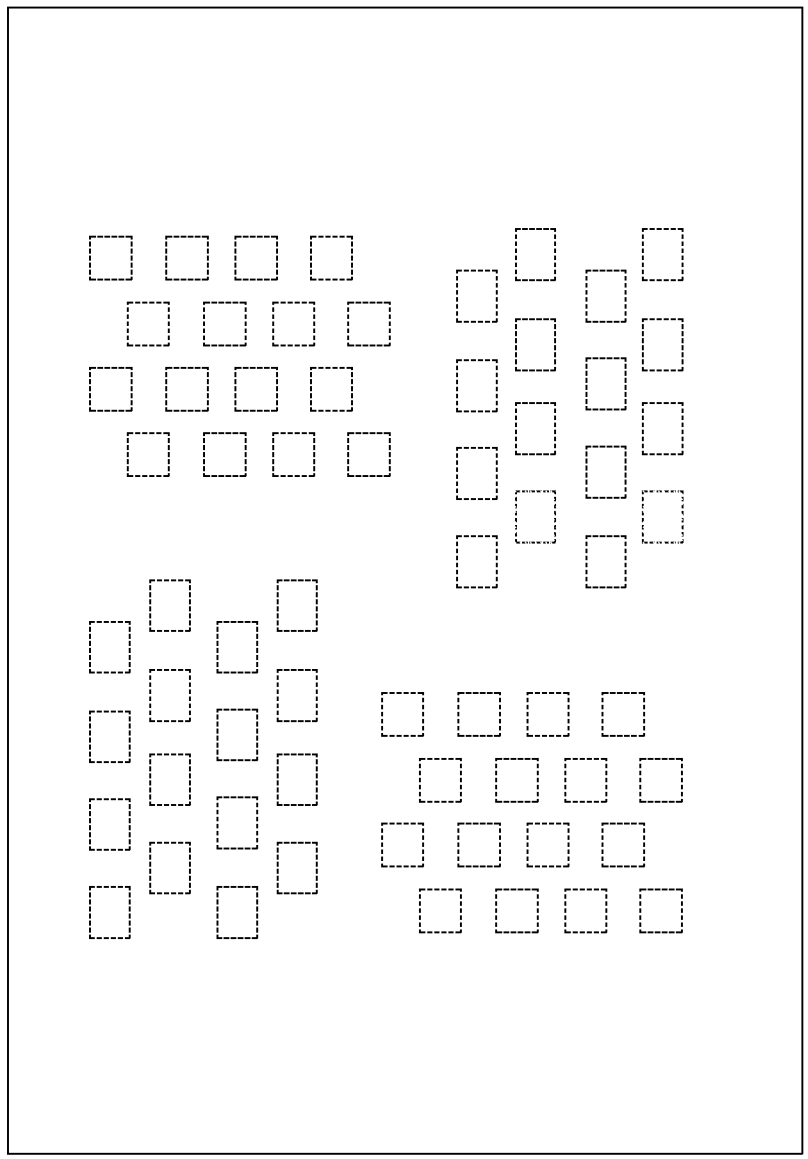
FIG. 3F is a mask pattern of conductive pads.
Figure 4:
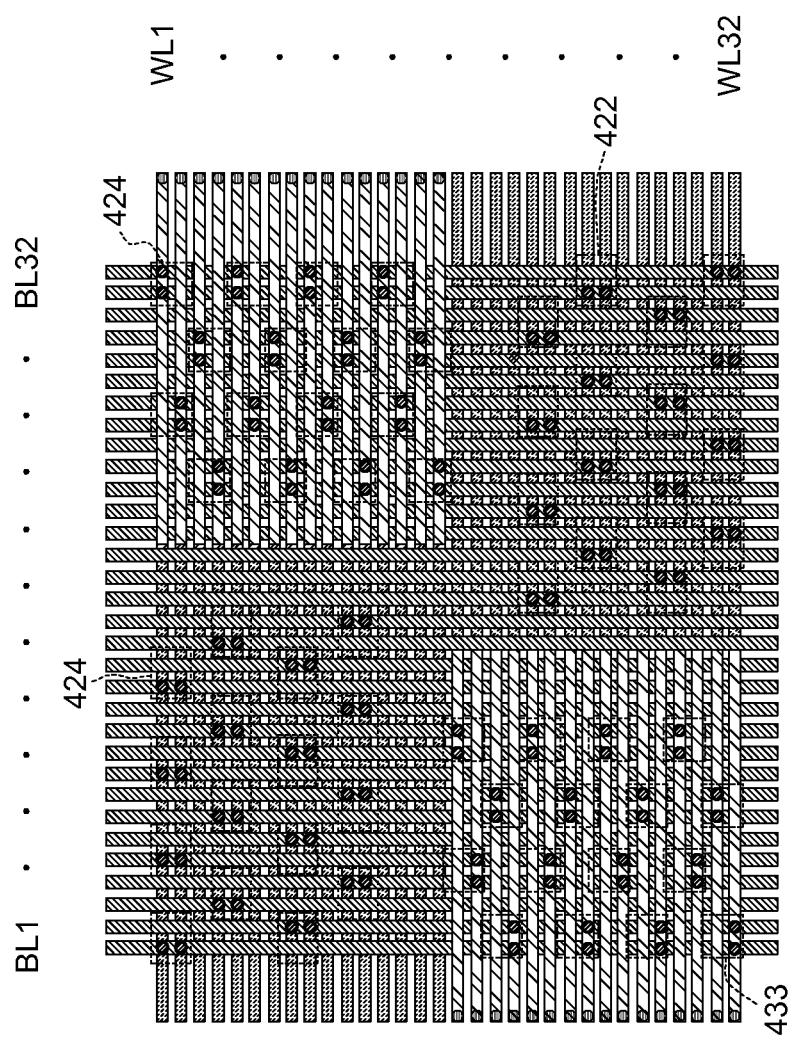
FIG. 4 is a top view of an array chip according to another embodiment of the disclosure.

Please refer to FIG. 2, FIG. 3A-FIG. 3F and FIG. 4. FIG. 2 is a top view of an array chip according to one embodiment of the disclosure. FIG. 3A-FIG. 3F are mask patterns of the components of the array chip of the embodiment. FIG. 3A is a mask pattern of N of first conductive lines; FIG. 3B is a mask pattern of M of second conductive lines; FIG. 3C is a mask pattern of N of first vias; FIG. 3D is a mask pattern of N of third conductive lines; FIG. 3E is a mask pattern of M sets of second vias and N sets of third vias; and FIG. 3F is a mask pattern of conductive pads. FIG. 4 is a top view of an array chip according to another embodiment of the disclosure.

In the embodiment, N=32 of the first conductive lines (such as word lines) and M=32 of the second conductive lines (such as bit lines) are illustrated in the drawings. However, the invention is not limited thereto.

As shown in FIG. 2, the array chip includes N of first conductive lines (such as word lines) 301 disposed in parallel, M of second conductive lines (such as bit lines) 303 disposed in parallel, N of third conductive lines 305 disposed in parallel, N of first vias 304, M sets of second vias 322, 324, and N sets of third vias 331, 333. M and N are positive integers. The second conductive lines 303 are formed on the first conductive lines 301 and perpendicular to the first conductive lines 301. The second conductive lines 303 and the first conductive lines 301 form an overlapping area. The overlapping area could be virtually divided into four regions, including: a first region 41 and a third region 43 at a diagonal direction, and a second region 42 and a fourth region 44 at the other diagonal direction.

In the embodiment, N of first vias 304 respectively connect to the first conductive lines 301. Take 32 of the first conductive lines 301 for example. N of first vias 304 could be divided into at least two groups, including the first one to the sixteenth first via (i.e. the [N/2]-th first via) 304 positioned at the right ends of the first one to the sixteenth first conductive line (i.e. the [N/2]-th first conductive line) 301 for electrical connection; the seventeen first via (i.e. the [(N/2)+1]-th first via) 304 to the thirty-second first via (i.e. the N-th first via) 304 positioned at the left ends of the seventeen first conductive line (i.e. the [(N/2)+1]-th first conductive line) 301 to the thirty-second first conductive line (i.e. the N-th first conductive line) 301 for electrical connection.

N of third conductive lines 305 are disposed on the second conductive lines 303, and perpendicular to the second conductive lines 303. The third conductive lines 305 are also parallel to the first conductive lines 301, and could be divided into at least two groups respectively disposed in the first region 41 and the third region 43 of the overlapping area at a diagonal direction. Take 32 of the first conductive lines 301 and third conductive lines 305 for example. The first third conductive line to the sixteenth (i.e. [N/2]-th) third conductive line 305 are positioned in the first region 41, and the seventeen (i.e. [(N+1)/2]-th) third conductive line 305 to the thirty-second (i.e. N-th) third conductive line 305 are positioned in the third region 43. In one embodiment, a length of each third conductive line 305 is smaller than a half length of each first conductive line 301.

M sets of second vias 322 and 324 could be divided into at least two groups respectively disposed in the second region 42 and the fourth region 44 of the overlapping area at the other diagonal direction. In one embodiment, the first set to the [M/2]-th set of the second vias 322 are distributed in the second region 42 evenly, and the [(M+1)/2]-th set to the M-th set of the second vias 324 are distributed in the fourth region 44 evenly. Also, each set of the second vias may include one or more vias and is connected to the same second conductive line 303. As shown in FIG. 2, each set of the second vias includes two vias, which are disposed at positions corresponding to the intersections of the second conductive lines 303 and the first conductive lines 301, and the two vias connect the same second conductive line 303.

In the embodiment, 32 word lines and 32 bit lines are the first conductive lines 301 and second conductive lines 303 for illustration. Sixteen sets of the second vias 324 are distributed in the fourth region 44 evenly. The first set of the second vias 324 are positioned at the first bit line (BL1) and corresponding to the first and second word lines (WL1, WL2). The second set of the second vias 324 are positioned at the second bit line (BL2) and corresponding to the eighth and ninth word lines (WL8, WL9). The third set of the second vias 324 are positioned at the third bit line (BL3) and corresponding to the fourth and fifth word lines (WL4, WL5). The fourth set of the second vias 324 are positioned at the fourth bit line (BL4) and corresponding to the eleventh and twelfth word lines (WL11, WL12). Other sets of the second vias 324 in the fourth region 44 are arranged in the similar order, as depicted in FIG. 2. Also, Sixteen sets of the second vias 322 are distributed in the second region 42 evenly. The seventeenth set of the second vias 322 are positioned at the seventeenth bit line (BL17) and corresponding to the twenty-first and twenty-second word lines (WL21, WL22). The eighteenth set of the second vias 322 are positioned at the eighteenth bit line (BL18) and corresponding to the twenty-eighth and twenty-ninth word lines (WL28, WL29). The nineteenth set of the second vias 322 are positioned at the nineteenth bit line (BL19) and corresponding to the twenty-fourth and twenty-fifth word lines (WL24, WL25). The twentieth set of the second vias 322 are positioned at the twentieth bit line (BL20) and corresponding to the thirty-first and thirty-second word lines (WL31, WL32). Other sets of the second vias 322 in the second region 42 are arranged in the similar order, as depicted in FIG. 2. It is noted, of course, that the number and positions of the sets of second vias are not limited to the disposition of FIG. 2, and could be optionally selected and distributed according to the actual needs of practical application. Basically, it is better that the farther distance between the sets of second vias is achieved.

N sets of third vias 331 and 333 could be divided into at least two groups respectively disposed in the first region 41 and the third region 43, and connect to the third conductive line 305. In one embodiment, the first set to the [N/2]-th set of the third vias 331 are distributed in the first region 41 evenly, and the [(N+1)/2]-th set to the N-th set of the third vias 333 are distributed in the third region 43 evenly. Also, each set of the third vias may include one or more vias and is connected to the same third conductive line 305. As shown in FIG. 2, each set of the third vias includes two vias, which are disposed at positions corresponding to the intersections of the third conductive lines 305 and the second conductive lines 303, and the two vias connect the same third conductive line 305.

In the embodiment, 32 word lines and 32 bit lines are the first conductive lines 301 and second conductive lines 303 for illustration. Sixteen sets of the third vias 331 are distributed in the first region 41 evenly. The first set of the third vias 331 are positioned at the first word line (WL1) and corresponding to the the thirty-first and thirty-second bit lines (BL31, BL32). The second set of the third vias 331 are positioned at the second word line (WL2) and corresponding to the twenty-fifth and twenty-sixth bit lines (BL25, BL26). The third set of the third vias 331 are positioned at the third word line (WL3) and corresponding to the twenty-eighth and twenty-ninth bit lines (BL28, BL29). The fourth set of the third vias 331 are positioned at the fourth word line (WL4) and corresponding to the twenty-second and twenty-third bit lines (BL22, BL23). Other sets of the third vias 331 in the first region 41 are arranged in the similar order, as depicted in FIG. 2. Also, sixteen sets of the third vias 333 are distributed in the third region 43 evenly. The seventeenth set of the third vias 333 are positioned at the seventeenth word line (WL17) and corresponding to the tenth and eleventh bit lines (BL10, BL11). The eighteenth set of the third vias 333 are positioned at the eighteenth word line (WL18) and corresponding to the fourth and fifth bit lines (BL4, BL5). The nineteenth set of the third vias 333 are positioned at the nineteenth word line (WL19) and corresponding to the seventh and eighth bit lines (BL7, BL8). The twentieth set of the third vias 333 are positioned at the twentieth word line (WL20) and corresponding to the first and second bit lines (BL1, BL2). Other sets of the third vias 333 in the third region 43 are arranged in the similar order, as depicted in FIG. 2. It is also noted that the number and positions of the sets of third vias are not limited to the disposition of FIG. 2, and could be optionally selected and distributed according to the actual needs of practical application. Basically, it is better that the farther distance between the sets of third vias is achieved.

FIG. 4 is a top view of an array chip according to another embodiment of the disclosure. Compared to FIG. 2, the array chip of FIG. 4 further comprises a fourth conductive layer including plural conductive pads 431, 422, 433 and 424 (please referred to FIG. 3F, a mask pattern of conductive pads) disposed on the sets of second vias and the sets of third vias, and each conductive pad is electrically connected to one set of second vias or third vias. As shown in FIG. 4, the conductive pads 431 are positioned in the first region 41 and electrically connected to the third vias 331; the conductive pads 422 are positioned in the second region 42 and electrically connected to the second vias 322; the conductive pads 433 are positioned in the third region 43 and electrically connected to the third vias 333; the conductive pads 424 are positioned in the fourth region 44 and electrically connected to the second vias 324. The stability of electrically connection between the array chip and another chip could be improved due to formation of the conductive pads 431, 422, 433 and 424, thereby increasing the process reliability.

Figure 5:
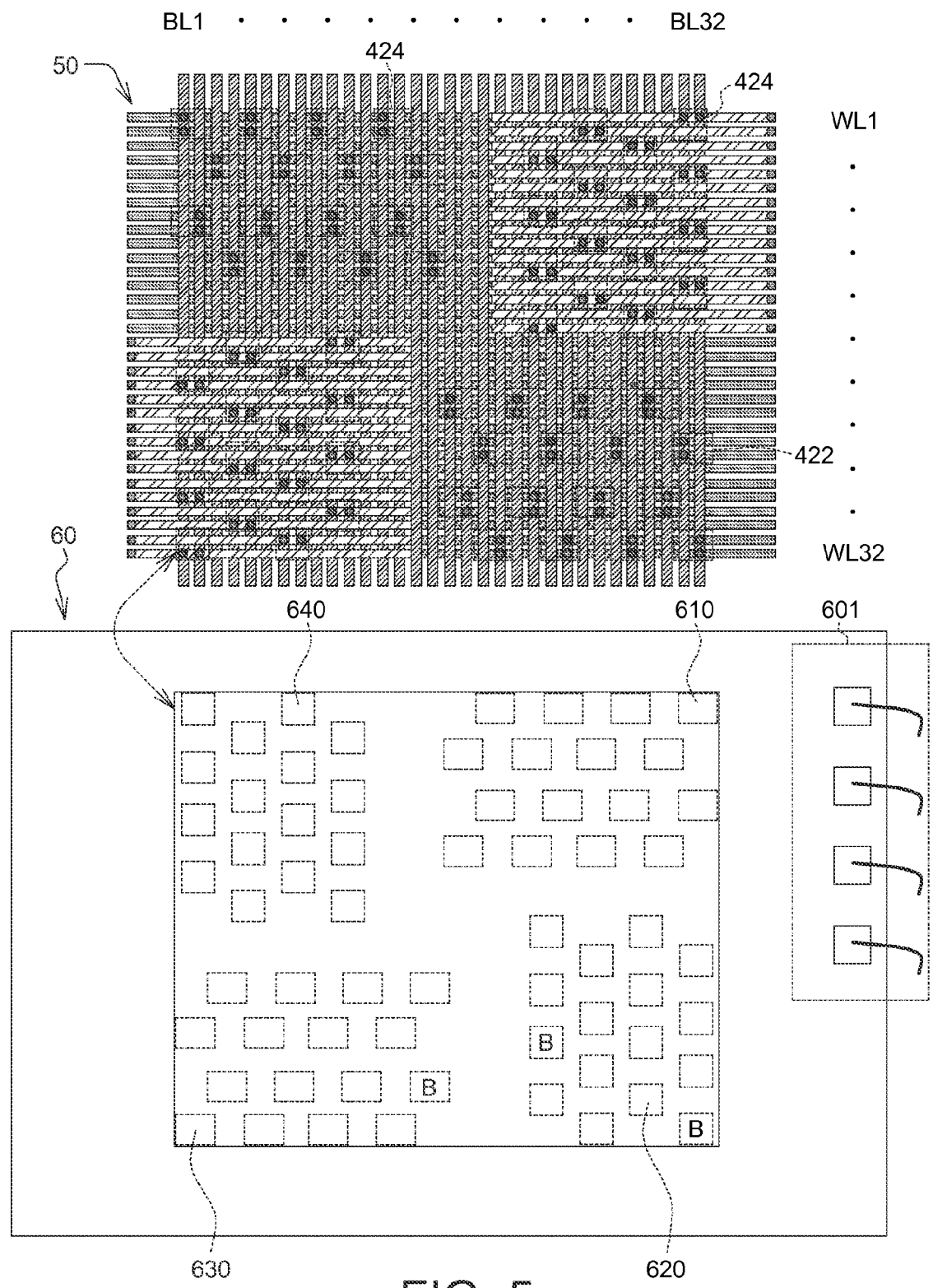
FIG. 5 shows an array chip and a periphery chip to-be-assembled according to an embodiment of the disclosure.

FIG. 5 shows an array chip and a periphery chip to-be-assembled according to an embodiment of the disclosure. The array chip 50 of FIG. 5 could be the same as the array chip of FIG. 4. However, the invention is not limited hereto. The array chip of FIG. 2 or other chips with different arrangements are applicable herein. Array of the array chip 50 could be a three-dimensional (3D) structure or 3D array, or could be NAND structure. The periphery chip 60 of FIG. 5 comprises plural bonding pads 610, 620, 630 and 640, formed correspondingly to the first region 41 to the fourth region 44. In the embodiment, the size of array chip 50 is smaller than the size of periphery chip 60. The array chip 50 could be face-to-face connected to the periphery chip 60 by (or not by) microbumps. Examples of microbumps include one or more elements selected from Sn, Ni, Pb, Ag, Au and Cu. As shown in FIG. 5, the bonding pads 610, 620, 630 and 640 are assembled to the conductive pads 431, 422, 433 and 424, respectively. The bad bonding pads (labeled as "B" in FIG. 5) could be corrected or repaired by ECC circuit with error correcting codes. The periphery chip 60 comprises a signal transferring area 601, having extra pads for outputting signal or connection out. The signal transferring area 601 could include components of I/O, power, address and ground (GND). Also, the signal transferring area 601 could have repair/ECC function, and accept one or more pads failure. Also, the signal transferring area 601 could have charge pumping circuit.

Figure 6:
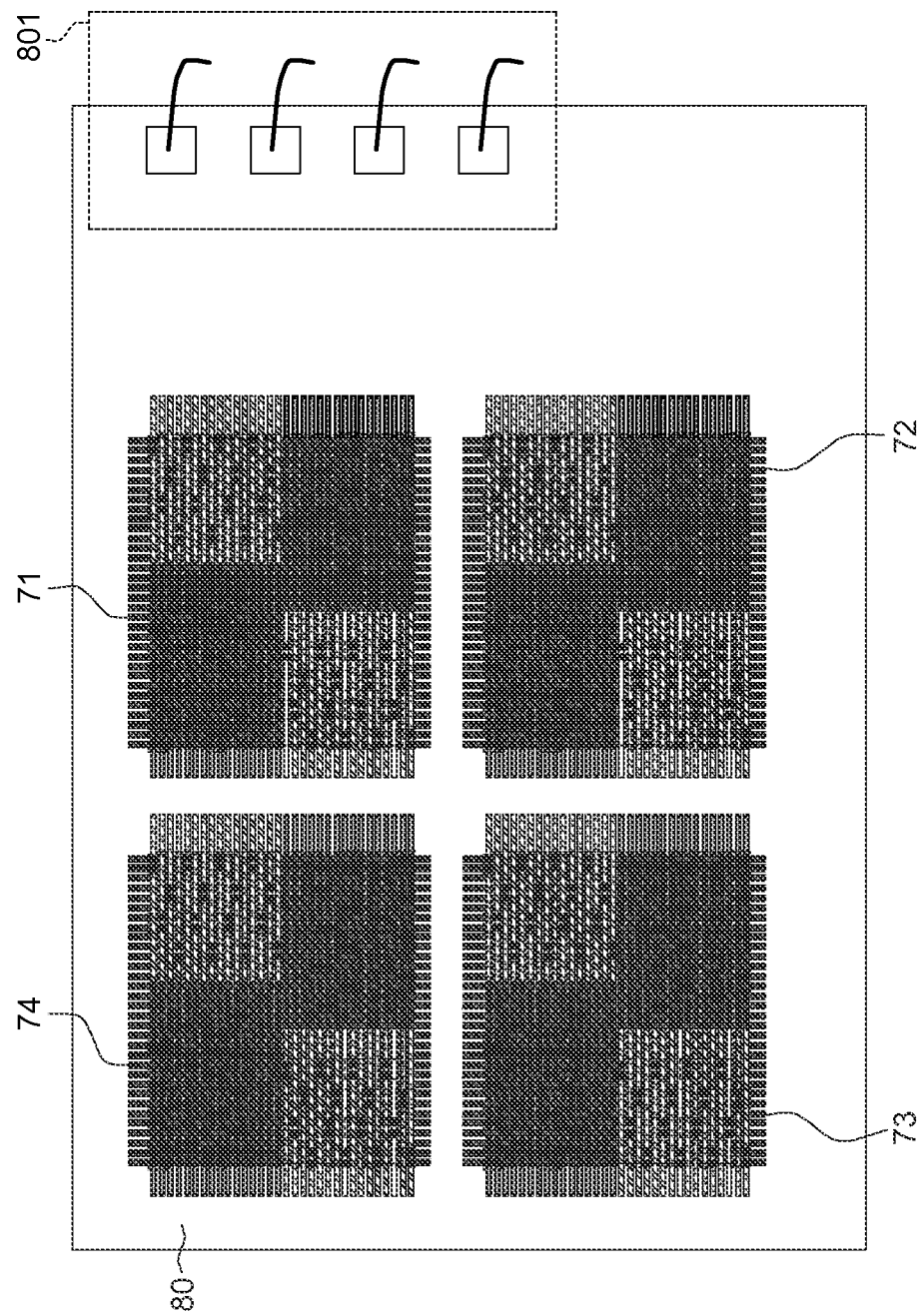
FIG. 6 shows several array chips assembled to a periphery chip according to another embodiment of the disclosure.

FIG. 6 shows several array chips assembled to a periphery chip according to another embodiment of the disclosure. Each small array chip comprises the structure and arrangements as shown in the array chip 50 of FIG. 4. Four array chips 71-74 assembled to one periphery chip 80 are depicted in FIG. 6. The periphery chip 80 also comprises a signal transferring area 801, having extra pads for outputting signal or connection out. This configuration could minimize the capacitive loading, and make simultaneous read, program and erase (read while write, RWW) possible, and also used for isolating defected "blocks".

In practical applications, array chips with different types could be assembled to a periphery chip for system-on-chip (SOC) requirements. For example, a random access memory (RAM) and a non-volatile memory (NVM) could be assembled to a periphery chip. Memory and other devices such as capacitance, non-Si device could be assembled to a logic substrate/periphery chip.

One or arrangements of the components constructed in the array chip is demonstrated but not limited below. It is known that the arrangements could be modified or changed according to the actual needs of practical applications. In the following description, 32 of word lines (the first conductive lines 301), 32 of bit lines (the second conductive lines 303), 32 sets of second vias 322 and 324, 32 sets of third vias 331 and 333, and 32 of conductive pads 431, 422, 433 and 424 are taken for illustration. Also, components common to FIG. 2 and FIG. 4 retain the same numeric designation.

Figure 7:
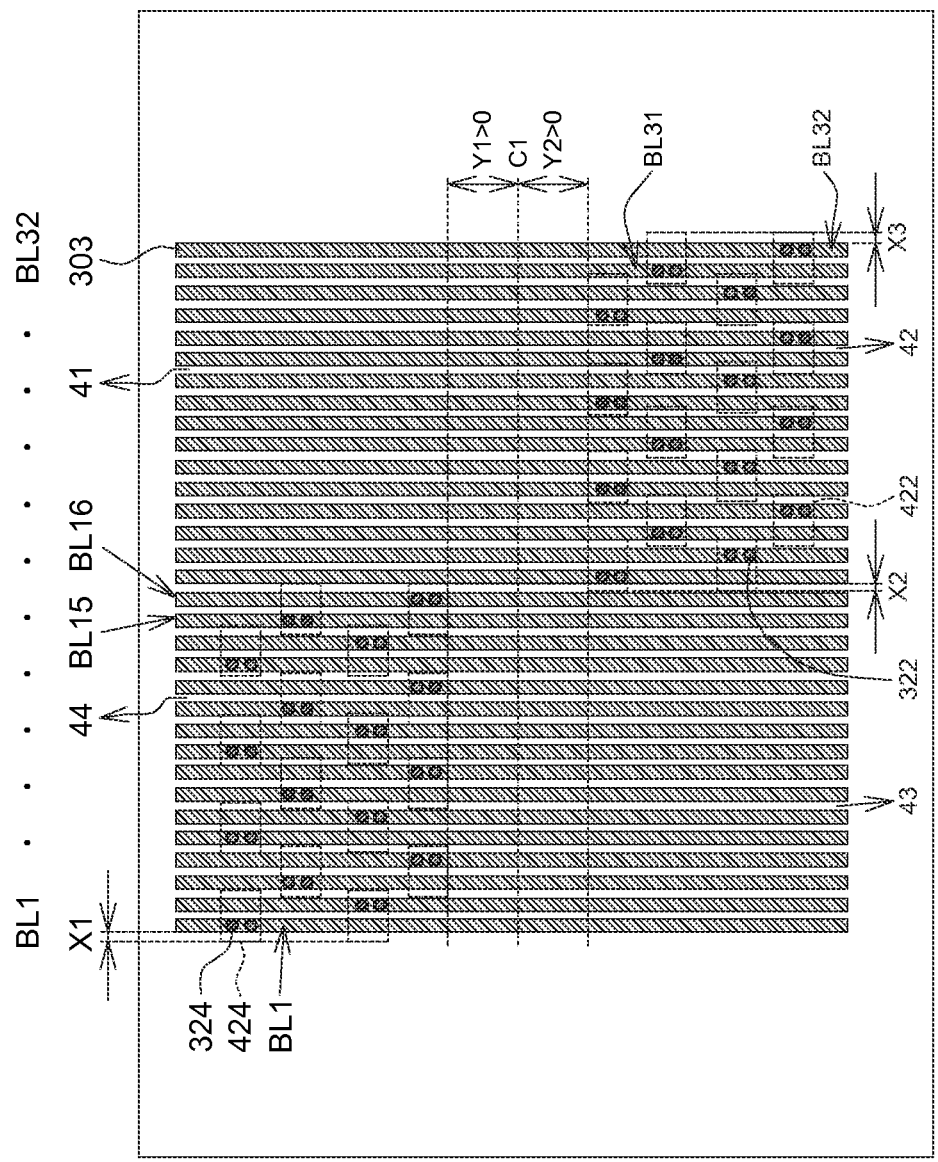
FIG. 7 shows the bit lines and the conductive pads in the second region and the fourth region of the array chip according to an embodiment of the disclosure.

FIG. 7 shows the bit lines and the conductive pads in the second region and the fourth region of the array chip according to an embodiment of the disclosure. The array chip has a first central line C1 (parallel to the first conductive lines 301/the third conductive lines 305, FIG. 2). The conductive pads 424 formed on the sets of second vias 324 positioned in the fourth region 44 and closest to the third region 43 (i.e. sets of second vias 324 on the BL4, BL8, BL12 and BL16) are spaced apart from the first central line C1 at a distance Y1. The conductive pads 422 formed on the sets of second vias 324 positioned in the second region 42 and closest to the first region 41 (i.e. sets of second vias 324 on the BL17, BL21, BL25 and BL29) are spaced apart from the first central line C1 at a distance Y2. Additionally, the first bit line (BL1) and the thirty-second bit line (BL32) are respectively spaced apart from the edges of the array chip at the distances X1 and X3, which are the distances extended by the conductive pads formed on the second vias on BL1 and BL32. Also, a distance extended from a conductive pad 424 on the second vias 324 on the sixteenth bit line (BL16) and a distance extended from a conductive pad 422 on the second vias 322 on the seventeenth bit line (BL17) are overlapped at a distance X2. In the embodiment, X1>0, X2>0 and X3>0.

Figure 8:
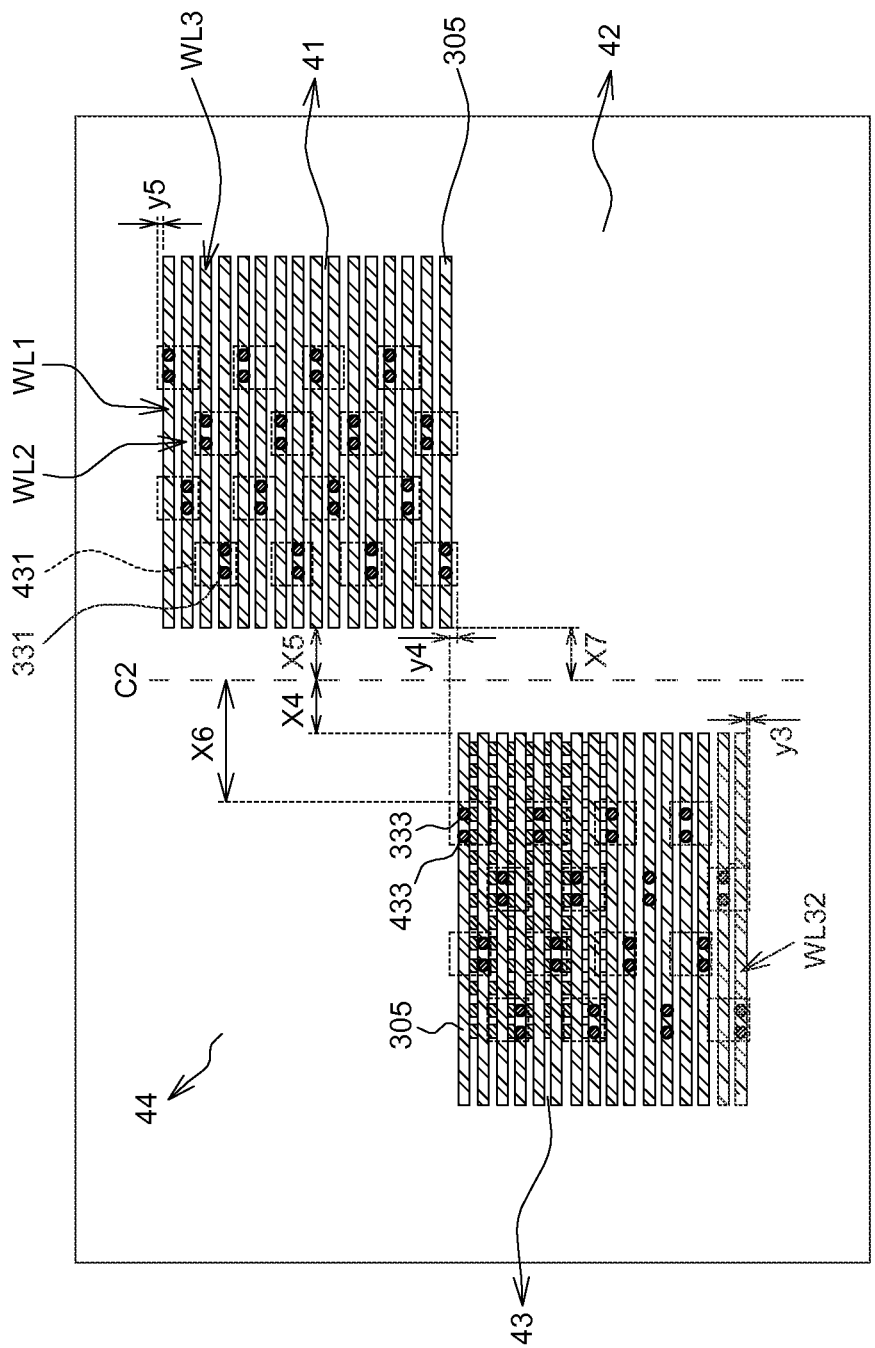
FIG. 8 shows the third conductive lines and the conductive pads in the first region and the third region of the array chip according to an embodiment of the disclosure.

FIG. 8 shows the third conductive lines and the conductive pads in the first region and the third region of the array chip according to an embodiment of the disclosure. Since the third conductive lines 305 are disposed correspondingly to the word lines (the first conductive lines 301), the positions of the third conductive lines 305 are identical to 32 of word lines. The array chip has a second central line C2 (parallel to the second conductive lines 303, FIG. 2). The third conductive lines 305 in the third region 43 and the first region 41 are spaced apart from the second central line C2 at a distance X4 and a distance X5, respectively. The conductive pads 433 formed on the sets of third vias 333 positioned in the third region 43 and closest to the first region 41 (i.e. sets of third vias 333 on the WL17, WL21, WL25 and WL29) are spaced apart from the first central line C2 at a distance X6. The conductive pads 431 formed on the sets of third vias 331 positioned in the first region 41 and closest to the fourth region 44 (i.e. sets of third vias 331 on the WL4, WL8, WL12 and WL16) are spaced apart from the first central line C2 at a distance X7. In the embodiment, X4>0, X5>0 and X6>0, X7>0, X6>X4, and X7>X5. Additionally, the first word line (WL1) and the thirty-second word line (WL32) are respectively spaced apart from the edges of the array chip at the distances Y5 and Y3, which are the distances extended by the conductive pads 431 and 433 formed on the third vias on WL1 and WL32. Also, a distance extended from a conductive pad 431 on the third vias 331 on the sixteenth word line (WL16) and a distance extended from a conductive pad 433 on the third vias 333 on the seventeenth word line (WL 17) are overlapped at a distance Y4. In the embodiment, Y3>0, Y4>0 and Y5>0.

In practical applications, the word lines could comprise the selector transistors, and the selector transistors may have repair functions. Also the word lines could comprise dummy word lines, and the bit lines could comprise dummy bit lines. Therefore, the memory array could be repaired optionally.

According to the embodiment, a semiconductor structure and a method of manufacturing the same are provided by separately forming an array chip and a periphery chip as two chips. Plural Vias are formed in the array chip. The array chip is then assembled to a periphery chip, wherein the array chip is electrical connected to the periphery chip by the vias. The structure of the embodiment solves the contact connection problem between the array area and the periphery area of the small conventional chips. In the trend of chip size reduction, the great stability of electrical connection between the array chip and the periphery chip is still maintained. Also, larger "pads" (i.e. conductive pads on the array chip and bonding pads on the periphery chip) for chip-to-chip connection would lower the cost.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first chip, comprising:
   N of first conductive lines disposed in parallel, N is positive integer;
   M of second conductive lines perpendicularly disposed on the first conductive lines and arranged in parallel, and the second and first conductive lines forming an overlapping area, M is positive integer;
   N of third conductive lines perpendicularly disposed on the second conductive lines and parallel to the first conductive lines, the third conductive lines being divided into at least two groups and respectively disposed in a first region and a third region at a diagonal direction of the overlapping area;
   N of first vias, respectively connected to the first conductive lines;
   M sets of second vias, divided into at least two groups and respectively disposed in a second region and a fourth region at the other diagonal direction of the overlapping area, and respectively connected to the second conductive lines; and
   N sets of third vias, divided into at least two groups and respectively disposed in the first region and the third region, and respectively connected to the third conductive lines; and
   a second chip, assembled to the first chip.

2. The semiconductor structure according to claim 1, further comprising:
   a plurality of conductive pads, disposed on said sets of second vias and said sets of third vias, and each conductive pad electrically connected to one set of second vias or third vias.

3. The semiconductor structure according to claim 1, wherein the first set to the [M/2]-th set of the second vias are distributed in the second region evenly, and the [(M+1)/2]-th set to the M-th set of the second vias are distributed in the fourth region evenly.

4. The semiconductor structure according to claim 1, wherein each set of the second vias includes at least two vias, which are disposed at positions corresponding to the intersections of the second conductive lines and the first conductive lines, connect the same second conductive line.

5. The semiconductor structure according to claim 1, wherein the first set to the [N/2]-th set of the third vias are distributed in the first region evenly, and the [(N+1)/2]-th set to the N-th set of the third vias are distributed in the third region evenly.

6. The semiconductor structure according to claim 1, wherein each set of the third vias includes at least two vias, which are disposed at positions corresponding to the intersections of the third conductive lines and the second conductive lines, connect the same third conductive line.

7. The semiconductor structure according to claim 1, wherein the first chip has a first central line parallel to the third conductive lines, and the sets of second vias positioned in the fourth region and closest to the third region are spaced apart from the first central line at a first distance; and
   the sets of second vias positioned in the second region and closest to the first region are spaced apart from the first central line at a second distance.

8. The semiconductor structure according to claim 1, wherein the first set of third vias and the N-th set of third vias positioned in the first region and the third region are spaced apart from edges of an array region at a third distance, respectively.

9. The semiconductor structure according to claim 1, wherein the first chip has a second central line parallel to the second conductive lines, and the third conductive lines positioned in the third region and the first region are spaced apart from the second central line at a fourth distance and a fifth distance, respectively.

10. The semiconductor structure according to claim 1, wherein the first third conductive line to the [N/2]-th third conductive line are positioned in the first region, and the [(N+1)/2]-th third conductive line to the N-th third conductive line are positioned in the third region, wherein a length of each third conductive line is smaller than a half length of each first conductive line.

11. The semiconductor structure according to claim 1, wherein the second chip comprises a plurality of bonding pads electrically connected to the sets of second vias and the sets of third vias after the first chip is assembled to the second chip.

12. The semiconductor structure according to claim 1, wherein the first chip is a memory array chip, and the second chip is a periphery circuit chip.

13. The semiconductor structure according to claim 1, further comprising the several first chips assembled to the second chip.

14. A method of manufacturing semiconductor structure, comprising:
    providing a first chip, comprising:
    forming N of first conductive lines in parallel, N is positive integer;
    forming M of second conductive lines in parallel on the first conductive lines, and the second conductive line perpendicularly to the first conductive lines, and the second and first conductive lines forming an overlapping area, M is positive integer;
    forming N of first vias, respectively connected to the first conductive lines;
    forming N of third conductive lines in parallel on the second conductive lines and the third conductive lines perpendicularly to the second conductive lines and parallel to the first conductive lines, the third conductive lines being divided into at least two groups and respectively disposed in a first region and a third region at a diagonal direction of the overlapping area;

forming M sets of second vias, comprising at least two groups and respectively disposed in a second region and a fourth region at the other diagonal direction of the overlapping area, and respectively connected to the second conductive lines; and forming N sets of third vias, comprising at least two groups and respectively disposed in the first region and the third region, and respectively connected to the third conductive lines; and providing a second chip, and assembling the first chip to the second chip.

15. The method according to claim 14, wherein the step of providing the first chip further comprising:

Forming a plurality of conductive pads on the sets of second vias and the sets of third vias, and electrically connected thereto.

16. The method according to claim 14, wherein the first set to the [M/2]-th set of the second vias are distributed in the second region evenly, and the [(M+1)/2]-th set to the M-th set of the second vias are distributed in the fourth region evenly.

17. The method according to claim 14, wherein each set of the second vias includes at least two vias, which are disposed at positions corresponding to the intersections of the second conductive lines and the first conductive lines, connect the same second conductive line.

18. The method according to claim 14, wherein the first set to the [N/2]-th set of the third vias are distributed in the first region evenly, and the [(N+1)/2]-th set to the N-th set of the third vias are distributed in the third region evenly.

19. The method according to claim 14, wherein each set of the third vias includes at least two vias, which are disposed at positions corresponding to the intersections of the third conductive lines and the second conductive lines, connect the same third conductive line.

20. The method according to claim 14, wherein the second chip comprises a plurality of bonding pads, when the first chip is assembled to the second chip, the bonding pads are electrically connected to the sets of second vias and the sets of third vias.

* * * * *